(12) United States Patent
Hsu

(10) Patent No.: US 7,359,590 B2
(45) Date of Patent: Apr. 15, 2008

(54) SEMICONDUCTOR DEVICE INTEGRATED WITH OPTOELECTRONIC COMPONENTS

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 3 days.

(21) Appl. No.: 11/487,865

(22) Filed: Jul. 17, 2006

(65) Prior Publication Data

US 2007/0104413 A1 May 10, 2007

(30) Foreign Application Priority Data

Nov. 8, 2005 (TW) .............................. 94139069 A

(51) Int. Cl.
*G02B 6/12* (2006.01)
*G02B 6/26* (2006.01)
*H01S 3/04* (2006.01)

(52) U.S. Cl. ............................ 385/14; 385/31; 385/49; 372/36

(58) Field of Classification Search ...................... None
See application file for complete search history.

(56) References Cited

U.S. PATENT DOCUMENTS

| | | | | |
|---|---|---|---|---|
| 5,745,984 A | * | 5/1998 | Cole et al. ..................... | 29/834 |
| 6,597,713 B2 | * | 7/2003 | Ouchi .......................... | 372/36 |
| 6,808,643 B2 | * | 10/2004 | Ho et al. ....................... | 216/13 |
| 6,839,476 B2 | | 1/2005 | Kim et al. | |
| 7,112,885 B2 | * | 9/2006 | Chen et al. .................. | 257/728 |
| 2003/0156402 A1 | * | 8/2003 | Ding et al. .................. | 361/820 |
| 2005/0087747 A1 | * | 4/2005 | Yamada et al. ............... | 257/80 |

* cited by examiner

*Primary Examiner*—Tina M Wong
(74) *Attorney, Agent, or Firm*—Sawyer Law Group LLP

(57) ABSTRACT

A semiconductor device integrated with optoelectronic components includes a carrier board with at least two openings; a first and a second optoelectronic component disposed in the openings respectively, each of them having an active surface and an opposite non-active surface, wherein the active surface has a plurality of electrode pads and an optical active area; a dielectric layer formed on a surface of the carrier board and the active surfaces, and having a plurality of vias and openings to expose the electrode pads and the optical active areas respectively; and a circuit layer formed on a surface of the dielectric layer and electrically connected to the electrode pads directly. Then, at least one waveguide is formed on the surface of the semiconductor device integrated with the optoelectronic component to provide signal transmitting between the first and second optoelectronic components, therefore, shortens the signal transmission path, reduces the transmission loss and noise, and hence improves the signal transmission quality.

15 Claims, 4 Drawing Sheets

SEMICONDUCTOR DEVICE INTEGRATED WITH OPTOELECTRONIC COMPONENTS

CROSS-REFERENCE TO RELATED APPLICATION

This application claims benefit under 35 USC 119 to Taiwan Application No. 094139069, filed Nov. 8, 2005.

FIELD OF THE INVENTION

The present invention relates to semiconductor devices integrated with optoelectronic components, and, more particularly, to a semiconductor device having optoelectronic components, a waveguide and a circuit structure.

BACKGROUND OF THE INVENTION

The development of semiconductor technology improves day by day rapidly, besides mainly focusing on the tiny packaging of the model, nowadays the data storage capacity is increasing gradually also. Therefore, with the increasing data quantity, the least time taken to process the same quantity data shows a higher efficiency in data processing. The straightest way to increase the semiconductor's processing rate is to increase the utilization ratio, but facing bottlenecks such as heatsink for high power, delay of signal time and electric magnetic interruption (EMI) when the data transmission is above Gb/s, which makes the fabrication of the higher performance semiconductor more difficult. Especially when the copper circuit is conventionally used as a carrier for data transmission, with the limitation of this material's natural conductivity, the achieved conductivity cannot be increased further, therefore the signal transmission rate cannot be increased by increasing the conductivity.

In addition, the metallic circuit structure for signal transmission is easy to have interruption from the outside noise or interference from the inner circuit, results in signal transmission error due to the interruption and interference during the signal transmitting process; therefore, some protection methods are required for the signal transmission structure to prevent the interruption and interference occur to affect the signal, especially obvious in the high frequency transmission. The protection methods have increased some difficulties and extra structure design for the circuit design, results in increasing in the design cost and the fabrication cost, and therefore, the present condition is hard to make a breakthrough.

Moreover, the conventional signal transmission method is an analogue signal transmission method using electric current through the conductor, but the signal processing methods inside the circuits nowadays mostly are digital processing; therefore a distortion may occur after conversion during the transmitting process.

In order to resolve the drawbacks from the conventional analogue signal transmission structure, new technique of transmission method is using the optical signal to replace the electrical signal, and the most obvious improvement is that the optical signal almost will not be interrupted by the electromagnetic wave; therefore has a better signal transmission quality and reduce the signal transmission distortion. Also the structure design for preventing electric and magnetic wave can be decreased, results in reducing in the design and fabrication cost. Thus, using optics as a signal transmission method has become a direction in future development.

The conventional way of designing the optical electronics transmission structure into the printed circuit board's structure, is to add a guiding layer containing organic waveguide film into the printed circuit board, then integrate the assembly of the optical electronics components and driving components onto the printed circuit board; so the guiding layer can be used as the path for optical signal transmission to achieve the high speed transmission purpose. Referring to FIG. 1 for the U.S. Pat. No. 6,839,476, showing a saturated layer 12 forming above the bottom layer 11, and a plurality of grooves 12a are formed in the saturated layer 12; then place an optical fiber 13 into the groove 12a, and form another top layer 14 above the saturated layer 12 to embed the optical fiber 13 in the saturated layer 12; thereof the optical fiber 13 is a core 13a covered by a cladding 13b outside. Then the two terminals of the optical fiber 13 can be set up with optical emitter and receiver modules and optical passive components, to transmit optical signal by the optical fiber 13 to avoid the drawbacks from electrical signal transmission.

However, the optical fiber 13 is embedded in the saturated layer 12 and the groove 12a, thus the saturated layer 12 needs to have a grooving fabrication first, then places the optical fiber 13 into the groove 12a. An automatic placing movement, like the conventional insertion movement when inserting electronic components into circuit board, completes the fabrication process of placing the optical fiber 13 into the groove 12a; therefore the speed of the fabrication is slow, and cannot achieve the rapid production purpose.

Moreover, the optical fiber 13 needs to be cut first according to the corresponding groove 12a length, and then places the optical fiber 13 into the groove 12a, which adds another process in the fabrication, therefore increases the fabrication difficulty; and the optical fiber 13 has different lengths, thereof increases the fabrication assorting difficulties, leads to the addition of the whole fabrication's processes and complexity, and consequently increases the fabrication cost.

At forming the groove 12a on the saturated layer 12 to place the optical fiber 13, the gap between the groove 12a and another groove 12a needs to be relatively spaced in size design, in order to locate the optical fiber 13 into the saturated layer 12; the distance of the gap affects the wiring density, also the wiring density is affected by the size of the optical fiber 13's diameter, thus, cannot achieve the purpose of high density wiring.

Beside, the optical fiber 13 used to transmit the optical signal is a core 13a covered by cladding 13b, and the inner layer of the cladding 13b can be used as reflection surface to allow the optical signal reflects forward continuously via the inner layer of the cladding 13b to achieve the signal transmission purpose. The optical fiber 13 and the circuit board have different fabrication structure, thus needs to be fabricated by another independent fabrication process and increases the whole fabrication's difficulty; and to integrate the two different fabrication products increase difficulty as well, thus cannot achieve the mass production purpose to lower the fabrication cost.

Thus, the increasing fabrication difficulty and cost due to optical fiber 13 has to be embedded in the saturated layer 12, and further, failing to meet the high density wiring requirements, has become problems for industries desired to be resolved.

Therefore, to provide an integrated device that can solve problems such as meet the small and lightweight electronic device requirement, lower the signal transmission loss, shorten the conduction path, reduce the noise, and thereby, leads to increase the optoelectronic signal transmission quality, simplify the fabrication processes, reduce the fabrication difficulty, and increase the mass production rate of the semiconductor, is a problem desires to be solved in industries.

SUMMARY OF THE INVENTION

In light of the above drawbacks in the prior art, an objective of the present invention is to provide a semiconductor device integrated with optoelectronic components, to fulfill the user requirement of a small and lightweight electronic device.

Another objective of the present invention is to provide a semiconductor device integrated with optoelectronic components, to lower the signal transmission loss, shorten the conduction path, reduce the noise, and increase the optoelectronic signal transmission quality.

A further objective of the present invention is to provide a semiconductor device integrated with optoelectronic components, to simplify the fabrication processes and reduce the fabrication difficulty.

A further objective of the present invention is to provide a semiconductor device integrated with optoelectronic components, to increase the complete heatsink efficiency.

In accordance with the above and other objectives, the present invention of a semiconductor device integrated with optoelectronic components, comprises: a carrier board with at least two openings; a first optoelectronic component and a second optoelectronic component disposed in the openings respectively, each of the first and second optoelectronic components having an active surface and an opposite non-active surface, wherein the active surface has a plurality of electrode pads and an optical active area; a dielectric layer formed on a surface of the carrier board and the active surfaces of the first and second optoelectronic components, the dielectric layer having a plurality of vias to expose the electrode pads of the first and second optoelectronic components and a plurality of openings to expose the optical active areas of the first and second optoelectronic components; and a circuit layer formed on a surface of the dielectric layer, and electrically connected to the electrode pads of the first and second optoelectronic components by electrical conductive structures formed in the vias of the dielectric layer.

The circuit layer described above is also formed with an insulating layer such as a solder mask layer. Beside, at least one waveguide is formed on the surface of the insulating layer, and the transmission terminal of the waveguide has a reflection surface and is located on the top of the insulating layer and the openings of the dielectric layer.

At other exemplary preferred embodiment, a circuit build-up structure is formed on the surface of the circuit layer and is electrically connected to the circuit layer, and openings are formed in the circuit build-up structure at positions corresponding to the first and second optoelectronic components to expose the optical active areas of the first and second optoelectronic components.

An insulating layer is further formed on a surface of the circuit build-up structure described above, and at least one waveguide is formed on the surface of the insulating layer. The transmission terminals of the waveguide, which are used as a signal transmission channel, are located on the openings of the insulating layer and the circuit build-up structure.

At another exemplary preferred embodiment, at least one waveguide is embedded at the circuit build-up structure, and the transmission terminal of the waveguide is in the opening of the circuit build-up structure.

Therefore, the present invention of the semiconductor device integrated with optoelectronic components mainly comprises a carrier board with at least two openings; a first optoelectronic component and a second optoelectronic component disposed in the openings respectively, each of the first and second optoelectronic components having an active surface and an opposite non-active surface, wherein the active surface has a plurality of electrode pads and an optical active area; a dielectric layer formed on a surface of the carrier board and the active surfaces of the first and second optoelectronic components, the dielectric layer having a plurality of vias to expose the electrode pads of the first and second optoelectronic components and a plurality of openings to expose the optical active areas of the first and second optoelectronic components; and a circuit layer formed on a surface of the dielectric layer, and electrically connected to the electrode pads of the first and second optoelectronic components by electrical conductive structures formed in the vias of the dielectric layer. In addition, let the optical active areas of the first and second optoelectronic components correspond to the openings of the dielectric layer, therefore to construct a semiconductor device integrated with optoelectronic components to fulfill the small and lightweight requirement for the electronic device.

Beside, an insulating layer and at least one waveguide are further formed on the surface of the circuit layer of the present invention, thereby simplifies the fabrication processes, reduces the fabrication difficulty and fabrication cost, and also increases the density of the circuit wiring.

Additionally, at least one waveguide is formed on the surface of the present invention of the semiconductor device integrated with optoelectronic components to provide signal transmitting between the first and the second optoelectronic components, therefore, shortens the signal transmission path, reduces the signal transmission loss and noise, and improves the optoelectronic signal transmission quality.

Beside, the carrier board can be a heat sink fabricated from high heat dissipating material such as metal or ceramics, therefore the heat generated by the first and the second optoelectronic components during operation can be dissipated to the outer environment rapidly and effectively, results in an increasing heatsink efficiency.

BRIEF DESCRIPTION OF THE DRAWINGS

FIG. 2A' is a cross-sectional diagram illustrating another embodiment of FIG. 2A;

FIG. 2C' is a cross-sectional diagram illustrating another embodiment of FIG. 2C;

FIG. 3B' is a cross-sectional diagram illustrating another embodiment of FIG. 3B.

DETAILED DESCRIPTION OF THE PERFERRED EMBODIMENTS

First Embodiment

Figure 1:
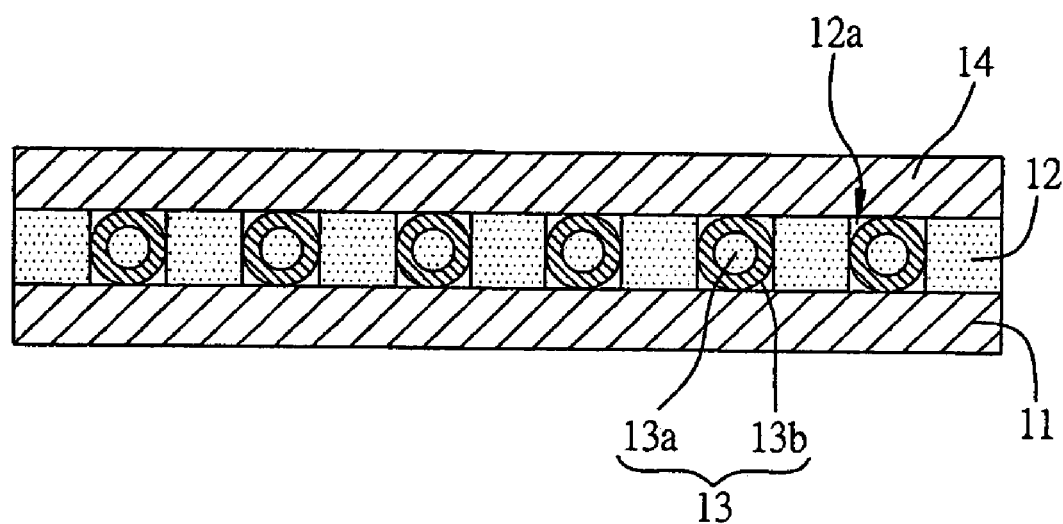
FIG. 1 (prior art) is a cross-sectional diagram of a structure disclosed in U.S. Pat. No. 6,839,476.
Figure 2A:
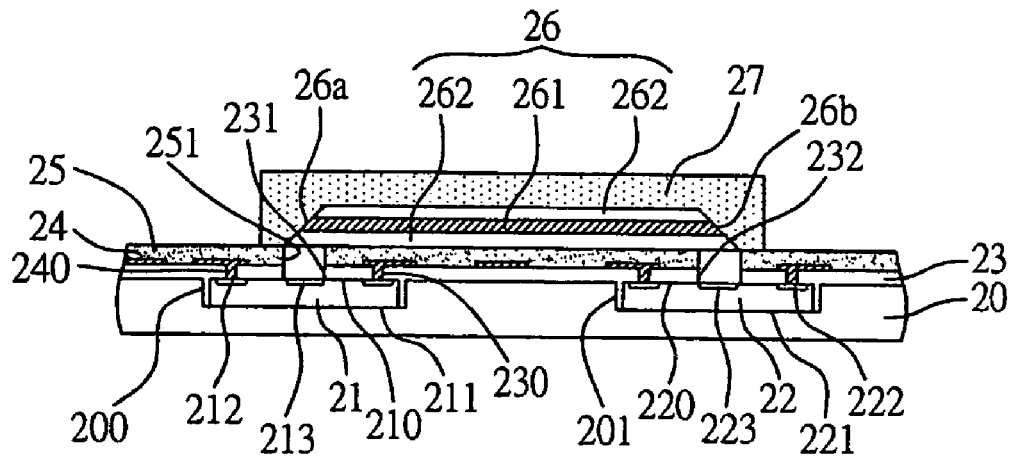
FIG. 2A is a cross-sectional diagram illustrating a semiconductor device integrated with optoelectronic components according to a first embodiment of the present invention.
Figure 2A:
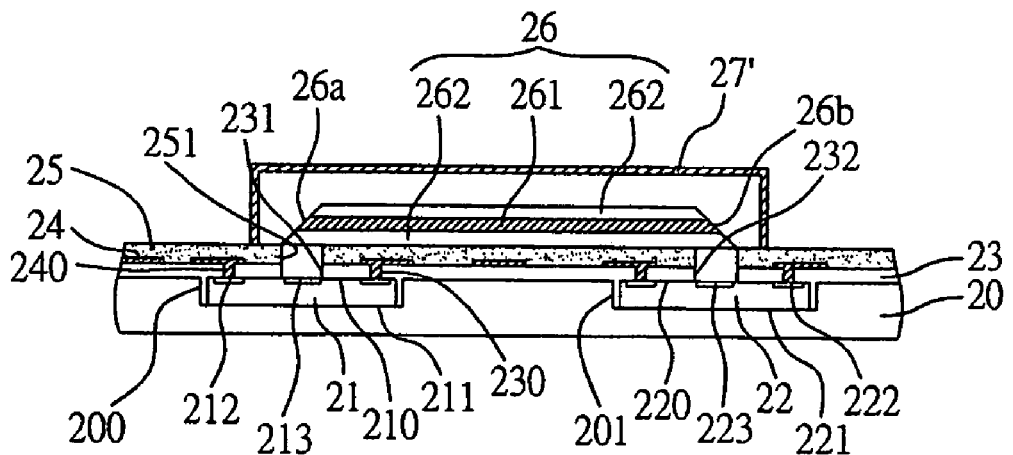

Referring to FIG. 2A, it is a cross-sectional diagram, illustrating the first embodiment of the present invention of a semiconductor device integrated with optoelectronic components.

As shown in the diagram, the optoelectronic component integrated in semiconductor device, comprises: a carrier board 20 with at least two openings 200, 201 that are not penetrating the carrier board; a first and a second optoelectronic components 21, 22 disposed in the openings respectively; a dielectric layer 23 formed on a surface of the carrier board 20 and active surface of the first and second optoelectronic components 21, 22; and a circuit layer 24 formed on the dielectric layer 23 and electrically connected to the first and second optoelectronic components 21, 22.

The carrier board 20 is an integrally formed heat sink and is made of one of metal and a ceramic material.

Figure 2B:
FIG. 2B is a cross-sectional diagram illustrating another example of a carrier board of the semiconductor device integrated with optoelectronic components according to the first embodiment of the present invention.

Beside, the carrier board 20 can be composed by stacking a plurality of carrying layers. Below is the description for the two-layer structure. As shown in FIG. 2B, the carrier board 20 comprises a first carrying layer 20a and a second carrying layer 20b. The second carrying layer 20b is formed on the first carrying layer 20a and has at least two openings 200b penetrating the second carrying layer 20b, and one end of each of the openings is blocked by the first carrying layer 20a, therefore forms openings 200b, 201b in the carrier board 20. The above first and second carrying layer 20a, 20b are made of one of metal and a ceramic material.

Each of the first and second optoelectronic components 21, 22 has an active surface 210, 220 and a non-active surface 211, 221 opposite to the active surface 210, 220, wherein the active surface 210, 220 has a plurality of electrode pads 212, 222 and an optical active area 213 223. The first and second optoelectronic components 21, 22 are disposed in the openings 200, 201 of the carrier board 20 respectively by linking their non-active surface 211, 221 to the openings 200, 201 via a thermal adhesive (not shown in the diagram). The first optoelectronic component 21 described above can be an optical active component or an optical passive component, and the second optoelectronic component 22 can be an optical active component or an optical passive component as opposed to the first optoelectronic component 21, wherein the optical active component is selected from the group consisting of laser diode (LD), light emitting diode (LED), and vertical cavity surface emitting laser (VCSEL), and the optical passive component is one of photo diode and a photo sensor component.

The dielectric layer 23 is formed on the surface of the carrier board 20 and the active surfaces 210, 220 of the first and second optoelectronic components 21, 22, and the dielectric layer 23 has a plurality of vias 230 to expose the electrode pads 212, 222 on the active surfaces 210, 220 of the first and second optoelectronic components 21, 22 and openings 231, 232 to expose the optical active areas 213, 223 on the active surfaces 210, 220 of the first and second optoelectronic components 21, 22 respectively. The dielectric layer 23 can be selected from the material group consisting of Epoxy resin, polyimide, cyanate easter, glass fiber, bismaleimide triazine (BT) or mixture of polyimide and glass fiber.

The circuit layer 24 is formed on the surface of the dielectric layer 23 and electrically connected to the electrode pads 212, 222 of the first and second optoelectronic components 21, 22 by electrical conductive structures 240 formed in the vias 230 of the dielectric layer 23. The present invention connects the circuit layer 24 directly to the electrode pads 212, 222 of the first and second optoelectronic components 21, 22 in order to construct a semiconductor device integrated with optoelectronic components to fulfill the small and lightweight requirement for the electronic device, and also, by the integrating of the optoelectronic components, shortens the signal transmission path, reduces the signal transmission loss and noise, and improves the optoelectronic signal transmission quality.

Beside, the surface of the circuit layer 24 is formed with an insulating layer 25 such as a solder mask layer to protect the circuit layer 24 underneath, and the insulating layer is formed with openings 251 to expose the optical active areas 213, 223 of the first and second optoelectronic components 21, 22; the surface of the insulating layer 25 is formed with at least one waveguide 26, and the waveguide 26 comprises a core layer 261 and a cladding layer 262 formed on a surface of the core layer 261. As shown in the diagram, the transmission terminals 26a, 26b of the waveguide 26 are located on the openings 251 of the insulating layer 25 and the openings 231, 232 of the dielectric layer 23, and facing the optical active areas 213, 223 of the first and second optoelectronic components 21, 22 respectively to enable the first and second optoelectronic components 21, 22 transmitting and receiving signal directly via the waveguide 26, leads to a shorten signal transmission path and reduces the signal loss at the connecting point. This can be widely applied at the high speed and high frequency signal transmission. The waveguide 26 described above has reflection surface at each of the transmission terminals 26a, 26b thereof.

Referring to FIGS. 2A and 2A', the insulating layer 25 and the waveguide 26 described above can be further formed with a protecting shield on the surface such as an encapsulant 27 or a metallic cap 27' to protect the waveguide 26 from the affecting factor outside.

Moreover, the openings 231, 232, 251 of the dielectric layer 23 and the insulating layer 25 can be filled with a light guiding material (not shown in the diagram) or are extracted to vacuum to reduce the interference from the outside noise.

Figure 2C:
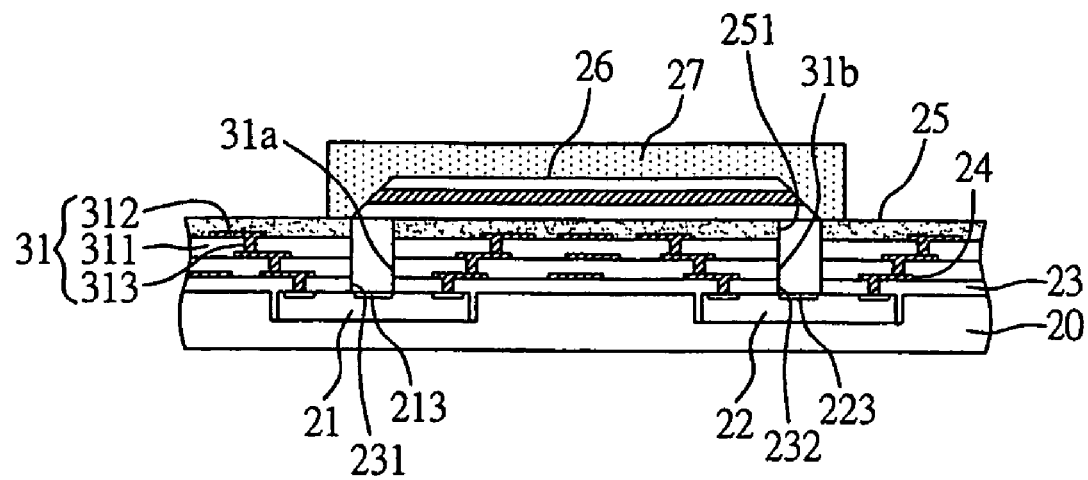
FIG. 2C is a cross-sectional diagram illustrating the semiconductor device integrated with optoelectronic components, which is provided with a circuit build-up structure, according to the first embodiment of the present invention.
Figure 2C:
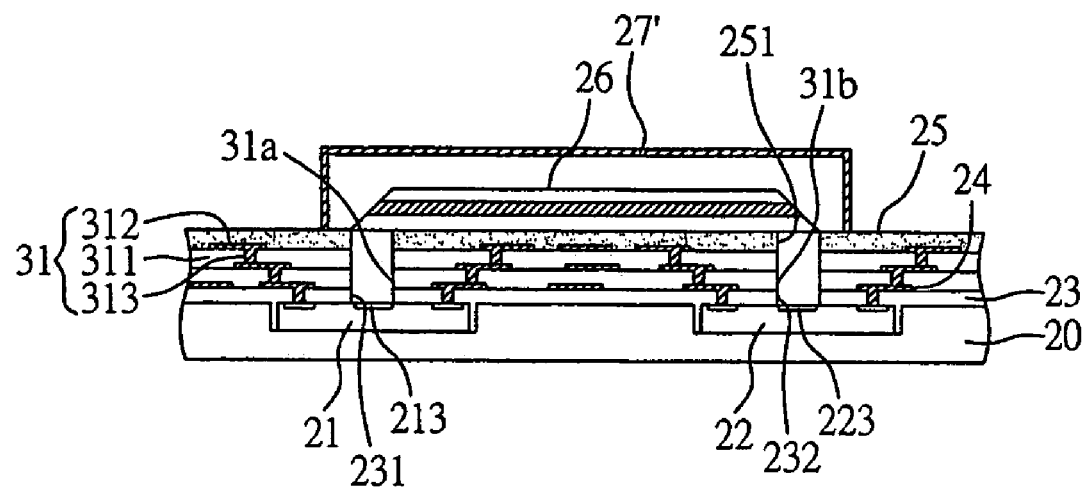

Referring to FIGS. 2C and 2C' for another embodiment of the present invention, a build-up fabrication can form a circuit build-up structure 31 on the dielectric layer 23 and the circuit layer 24 according to the reality needs from the electrical design, and openings 31a, 31b are formed in the circuit build-up structure 31 at positions corresponding to the optical active areas 213, 223 of the first and second optoelectronic components 21, 22 to expose the optical active areas 213, 223 of the first and second optoelectronic components 21, 22. Then the circuit build-up structure 31 is further formed with an insulating layer 25 on the surface, and is also formed with a waveguide 26 on the surface of the insulating layer 25; the two terminals 26a, 26b of the waveguide 26 are located on the opening 251 of the insulating layer 25 and the openings 31a, 31b of the circuit build-up structure 31, and facing the optical active areas 213, 223 of the first and second optoelectronic components 21, 22 respectively, to form an embedded plurality of optoelectronic components and form a semiconductor device integrated with optoelectronic components and multi-layer circuit, to fulfill the requirements of improving electrical design for the electronic products.

The insulating layer 25 and the waveguide 26 described above can be further formed with a protecting shield on the surface such as an encapsulant 27 or a metallic cap 27' to protect the waveguide 26 from the affecting factor outside.

Moreover, the openings 231, 232, 31a, 31b, 251 of the dielectric layer 23, the circuit build-up structure 31 and the insulating layer 25 can be filled with a light guiding material (not shown in the diagram) or are extracted to vacuum to reduce the interference from the outside noise.

Besides, the circuit build-up structure 31 comprises at least: a dielectric layer 311, a circuit layer 312 stacked on the dielectric layer 311, and electrical conductive structures 313 formed in the dielectric layer 311; the electrical conductive structure 313 is a conductive blind via, then the electrical conductive structure 313 electrically connected to the circuit layer 24 and forms openings 31a, 31b in the circuit build-up structure 31 at locations corresponding to the optical active areas 213, 223 of the first and second optoelectronic components 21, 22 to expose the optical active areas 213, 223 of the first and second optoelectronic components 21, 22 respectively.

Second Embodiment

Figure 3A:
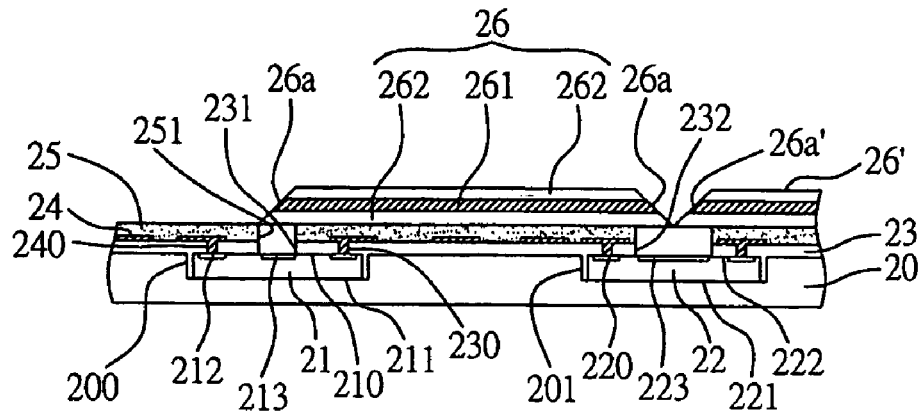
FIG. 3A is a cross-sectional diagram illustrating the semiconductor device integrated with optoelectronic components according to a second embodiment of the present invention.

As shown in FIG. 3A, it is a cross-sectional diagram, illustrating the second embodiment of the present invention of a semiconductor device integrated with optoelectronic components.

The semiconductor device integrated with optoelectronic components of the present embodiment is roughly the same with previous described first embodiment, the main differences of the semiconductor device integrated with optoelectronic components of the present embodiment is, further includes at least one waveguide 26' formed on the surface of the insulating layer 25, and the waveguide 26' has a transmission terminal 26a' with a reflection surface; the transmission terminal 26a is facing to the optical active area 223 of the second optoelectronic component 22 to let the second optoelectronic component 22 transmit the signal to other optoelectronic components via the waveguide 26', thereof expands the product's capacity.

Figure 3B:
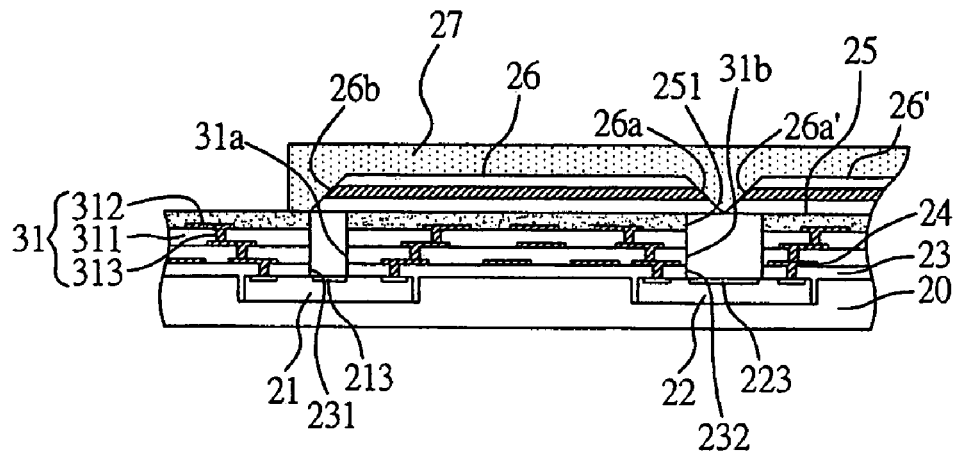
FIG. 3B is a cross-sectional diagram illustrating the semiconductor device integrated with optoelectronic components, which is provided with a circuit build-up structure, according to the second embodiment of the present invention.
Figure 3B:
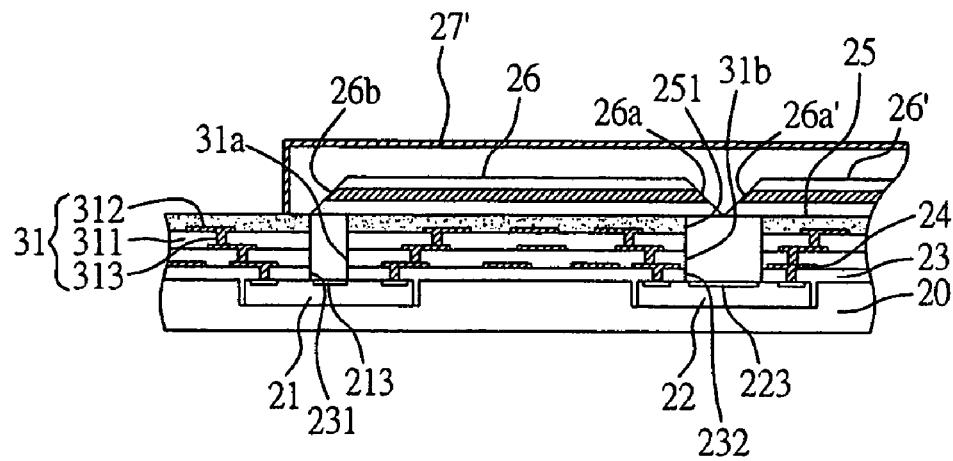

Referring to FIGS. 3B and 3B', the insulating layer 25 and the waveguides 26, 26' described above can be further formed with a protecting shield on the surface such as an encapsulant 27 or a metallic cap 27' to protect the waveguides 26, 26' from the affecting factor outside.

Third Embodiment

As shown in FIG. 3B, it is a cross-sectional diagram, illustrating the third embodiment of the present invention of a semiconductor device integrated with optoelectronic components.

The semiconductor device integrated with optoelectronic components of the present embodiment is roughly the same with previous described second embodiment, the main differences of the semiconductor device integrated with optoelectronic components of the present embodiment is, further includes a circuit build-up fabrication to form a circuit build-up structure 31 on the dielectric layer 23 and the circuit layer 24, and forms openings 31a, 31b in the circuit build-up structure 31 at locations corresponding to the optical active areas 213, 223 of the first and second optoelectronic components 21, 22 to expose the optical active areas 213, 223 of the first and second optoelectronic components 21, 22, and then the circuit build-up structure 31 is further formed with an insulating layer 25 on the surface, and is also formed with a plurality of waveguides 26, 26' on the surface of the insulating layer 25, therein the two terminals 26a, 26b of the waveguide 26 are located on the opening 251 of the insulating layer 25 and the openings 31a, 31b of the circuit build-up structure 31, and facing the optical active areas 213, 223 of the first and second optoelectronic components 21, 22 respectively; and another transmission terminal 26a' of the waveguide 26' is located on the opening 251 of the insulating layer 25 and the opening 31b of the circuit build-up structure 31 as well, to let the optical active area 223 of the second optoelectronic component 22 corresponds to the first and second optoelectronic components 21, 22. Therefore forms a semiconductor device integrated with optoelectronic components that embeds a plurality of optoelectronic components, waveguides and multi-layer circuit to let the second optoelectronic component 22 transmit the signal to other optoelectronic components via the waveguide 26', thereof expands the product's capacity and fulfills the using requirements of improving electrical design for the electronic products.

Beside, the insulating layer 25 and the waveguides 26, 26' described above can be further formed with a protecting shield on the surface such as an encapsulate 27 or a metallic cap 27' to protect the waveguide 26 from the affecting factor outside.

Moreover, the openings 231, 232, 251 of the dielectric layer 23 and the insulating layer 25 can be filled with a light guiding material (not shown in the diagram) or are extracted to vacuum to reduce the interference from the outside noise.

Therefore, the present invention of a semiconductor device integrated with optoelectronic components mainly comprises a carrier board with at least two openings that are not penetrating the carrier board, a first and a second optoelectronic components disposed in the openings respectively, a dielectric layer formed on the surfaces of the carrier board and the active surfaces of the first and second optoelectronic components, and a circuit layer formed on the dielectric layer and electrically connected to the electrode pads of the first and second optoelectronic components. And then an opening is formed in the dielectric layer, and the opening of the dielectric layer corresponds to the optical active areas of the first and second optoelectronic components in order to constitute a semiconductor device integrated with optoelectronic components to fulfill the small and lightweight requirement for the electronic device.

Beside, the surface of the circuit layer of the present invention can be further formed with an insulating layer and at least one waveguide, thereby simplifies the fabrication processes, reduces the fabrication difficulty and production cost, and also increases the density of the circuit wiring.

Additionally, at the present invention, the surface of the circuit layer can be formed with a circuit build-up structure according to the electrical design signal in reality, and the circuit build-up structure is further formed with at least one waveguide on the surface, to form a semiconductor module with integration of a multi-layer circuits and at least one waveguide, to fulfill the requirements of improving the capacity for the electronic products.

Moreover, the surface of the present invention of a semiconductor device integrated with optoelectronic components can be formed with at least one waveguide, to provide signal transmitting between the first and the second optoelectronic components, therefore, shortens the signal transmission path, reduces the signal transmission loss and noise, and improves the optoelectronic signal transmission quality.

At last, the carrier board of the present invention is a heat sink fabricated from high heat diffusive material such as metal or ceramics, therefore the heat generated by the first and the second optoelectronic components during operation can be diffused to the outer environment rapidly and effectively, thereby increases the heatsink efficiency of the optoelectronic component integrated in semiconductor device.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A semiconductor device integrated with optoelectronic components, comprising:
    a carrier board with at least two openings not penetrating the carrier board;
        a first optoelectronic component and a second optoelectronic component disposed in the openings respectively, each of the first and second optoelectronic components having an active surface and an opposite non-active surface, wherein the active surface has a plurality of electrode pads and an optical active area;
        a dielectric layer formed on a surface of the carrier board and the active surfaces of the first and second optoelectronic components, the dielectric layer having a plurality of vias to expose the electrode pads of the first and second optoelectronic components and a plurality of openings to expose the optical active areas of the first and second optoelectronic components;
        a circuit layer formed on a surface of the dielectric layer, and electrically connected to the electrode pads of the first and second optoelectronic components by electrical conductive structures formed in the vias of the dielectric layer; and
    an insulating layer formed on the surface of the circuit layer, wherein the insulating layer is formed with openings corresponding to the optical active areas of the first and second optoelectronic components to expose the optical active areas of the first and second optoelectronic components; and
    at least one waveguide formed on the surface of the insulating layer, wherein the transmission terminals of the at least one waveguide are located on the openings of the insulating layer and the openings of the dielectric layer, the at least one waveguide has a reflection surface at each of the transmission terminals thereof and the transmission terminals correspond to the optical active areas of the first and second optoelectronic components respectively.

2. The semiconductor device integrated with optoelectronic components of claim 1, wherein the waveguide comprises a core layer and a cladding layer formed on a surface of the core layer.

3. The semiconductor device integrated with optoelectronic components of claim 1, wherein the openings of the dielectric layer and the insulating layer are filled with a light guiding material or are extracted to vacuum.

4. The semiconductor device integrated with optoelectronic components of claim 1, wherein a protecting shield is further formed on the surface of the insulating layer and the waveguide.

5. The semiconductor device integrated with optoelectronic components of claim 4, wherein the protecting shield is one of an escapsulant and a metallic cap.

6. The semiconductor device integrated with optoelectronic components of claim 1, wherein a circuit build-up structure is formed on a surface of the dielectric layer and a surface of the circuit layer and is electrically connected to the circuit layer, and openings are formed in the circuit build-up structure at positions corresponding to the optical active areas of the first and second optoelectronic components to expose the optical active areas of the first and second optoelectronic components.

7. The semiconductor device integrated with optoelectronic components of claim 6, wherein the circuit build-up structure comprises a dielectric layer, a circuit layer stacked on the dielectric layer, and electrical conductive structures formed in the dielectric layer.

8. The semiconductor device integrated with optoelectronic components of claim 6, wherein the openings of the dielectric layer, the circuit build-up structure and the insulating layer are filled with a light guiding material or are extracted to vacuum.

9. The semiconductor device integrated with optoelectronic components of claim 1, wherein the carrier board is an integrally formed heat sink.

10. The semiconductor device integrated with optoelectronic components of claim 9, wherein the carrier board is made of one of metal and a ceramic material.

11. The semiconductor device integrated with optoelectronic components of claim 1, wherein the carrier board includes a first carrying layer and a second carrying layer formed on the first carrying layer, and the second carrying layer has at least two openings penetrating the second carrying layer and one end of each of the openings is blocked by the first carrying layer.

12. The semiconductor device integrated with optoelectronic components of claim 11, wherein the first and second carrying layers are made of one of metal and a ceramic material.

13. The semiconductor device integrated with optoelectronic components of claim 1, wherein the first optoelectronic component is one of an optical active component and an optical passive component, and the second optoelectronic component is one of an optical active component and an optical passive component as opposed to the first optoelectronic component.

14. The semiconductor device integrated with optoelectronic components of claim 13, wherein the optical active component is selected from the group consisting of laser diode (LD), light emitting diode (LED), and vertical cavity surface emitting laser (VCSEL).

15. The semiconductor device integrated with optoelectronic components of claim 13, wherein the optical passive component is one of a photo diode and a photo sensor component.

* * * * *